United States Patent [19]

Nicholson

[11] 4,138,784

[45] Feb. 13, 1979

[54] METHOD OF MAKING PRINTED CIRCUIT BOARD

[75] Inventor: Albert W. Nicholson, Clifton, England

[73] Assignee: National Research Development Corporation, London, England

[21] Appl. No.: 792,472

[22] Filed: Apr. 29, 1977

[30] Foreign Application Priority Data

May 3, 1976 [GB] United Kingdom ............... 17981/76

[51] Int. Cl.² .......................... B41M 3/08; H05K 1/04
[52] U.S. Cl. ..................................... 29/625; 174/68.5
[58] Field of Search .......................... 29/625, 626, 628; 174/68.5

[56] References Cited

U.S. PATENT DOCUMENTS

| 3,102,213 | 8/1963 | Bedson et al. | 29/625 UX |
| 3,163,588 | 12/1964 | Shortt et al. | 29/625 UX |
| 3,571,923 | 3/1971 | Shaheen | 29/625 |
| 4,017,968 | 4/1977 | Weglin | 29/625 |

Primary Examiner—Victor A. DiPalma
Attorney, Agent, or Firm—Cushman, Darby & Cushman

[57] ABSTRACT

A double-sided printed circuit board is described with a method for providing selective connection between conductors on the two faces of the board without the use of wire links or bridges. The board carries a plurality of plated-through holes arranged to provide all of the inter-connections which may be required in various combinations in a range of applications. When the actual combination required in a particular application is determined, those inter-connections which are not required are broken by removing part of the plating.

5 Claims, 4 Drawing Figures

METHOD OF MAKING PRINTED CIRCUIT BOARD

The present invention relates to a printed circuit board having means for connection between conductive areas on one face of the board and similar areas on the other face.

It is common practice in the design of printed circuits for related circuits or parts of a single circuit to be laid out on opposite faces of a board. At each point where an interconnection is required a hole is drilled through the board and the wall of the hole is plated to provide a conducting path. The plating is extended from the hole on each face to form a contact area or pad for use as a junction with the printed wiring at that point. If an interconnection is required to cross a printed wiring track a wire link must be used, spaced from the board face to form a bridge, with the ends soldered into the appropriate plated holes. A wire link is similarly used if an option exists for the connection of one point to one of two or more other points, particularly in a situation where the choice is not determined until the board is put into use. Considerable flexibility of design is possible at the expense of convenience in use by such methods.

A first aspect of the present invention comprises a method for producing a printed circuit board to provide selective connection between conductive areas on one face of the board and conductive areas on the other face of the board, the board being pierced by a plurality of holes extending from one face to the other and each of the holes having initially a wall lining of conductive material effective to provide electrical connection between one such conductive area on one face of the board and a corresponding conductive area on the other face, the method comprising the step of removing the conductive lining material from at least a selected one of the holes, so as to break the electrical connection provided by such hole.

Another aspect of the invention comprises a method for producing a printed circuit board to provide selective connection between conductive areas on one face of the board and conductive areas on the other face of the board, the board being pierced by a plurality of holes extending from one face to the other, the method comprising the steps of providing for each of the holes a wall lining of conductive material effective to provide electrical connection between one such conductive area on one face of the board and a corresponding conductive area on the other face and removing the conductive lining from at least a selected one of the holes, so as to break the electrical connection provided by such hole.

The conductive wall material of the or each hole may be removed by drilling the hole oversize.

The oversize drilling may extend only partially through the hole and may be such as to produce a chamfer on the edge of the hole.

According to a further aspect of the invention a printed circuit board comprises a plurality of holes having conductive wall linings, each of the holes extending through the board between a respective conductive area on one face and a corresponding conductive area on the other face, the conductive wall lining of at least one of the holes extending completely through the board so as to provide electrical connection between the associated conductive areas, and at least a selected one of the holes being at least partially enlarged to provide a break in electrical continuity therethrough.

It will be apparent that a printed circuit board in accordance with the invention provides a simple and economical solution to the problem of providing variants on a standard pattern of interconnection which is commonly met by the use of wire links. A basic printed circuit board can be designed having as many possible patterns of interconnection as may be required, and at the time when a specific selection is made of a particular form of circuit, those connections which are not in fact required are then readily removed.

An embodiment of the invention will be described with reference to the accompanying drawings in which.

Figure 1A:
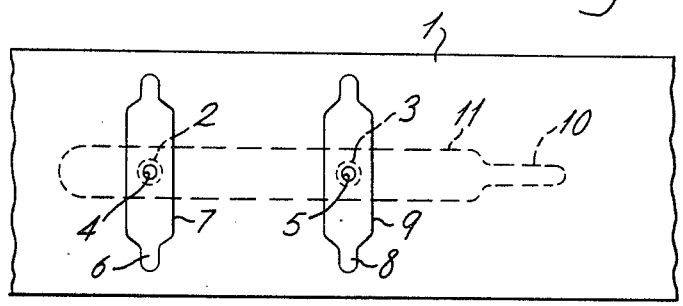
FIG. 1a represents diagrammatically a cross-section of a printed circuit board for use in carrying out the invention.
Figure 1B:
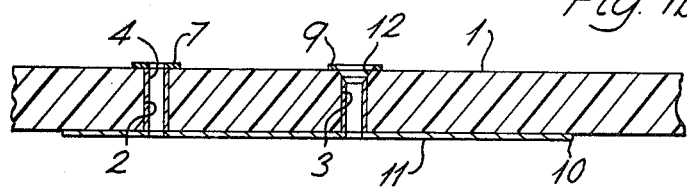
FIG. 1b represents diagrammatically the board of FIG. 1a after carrying out the invention.

Referring to FIG. 1a the upper surface of a printed circuit board 1 is viewed to show the initial state in which two similar holes 2, 3 are drilled through the board 1 and are internally plated or fitted with bushes to provide respective conductive wall linings 4 and 5. The lining 4 makes contact with a printed conductor 6 on the upper surface of the board 1 at a pad 7 and the lining 5 makes contact with a similar printed conductor 8 at a pad 9. On the lower surface of the board 1 a printed conductor 10 lies transversely to the conductors 6 and 8 and in contact with both of the linings 4 and 5 at an elongated pad 11. The conductor 10 is therefore connected to both of the conductors 6 and 8. The board 1 may be supplied for use in any application in which one of the interconnections 6-8-10, 6-10 and 8-10 is required. To obtain only the interconnection 6-10 the interconnection 8-10 is broken by drilling the hole 3 oversize for part or the whole of its length through the board 1. FIG. 1b shows a section through the board 1 in the plane which contains the holes 2 and 3 to illustrate the selection of the interconnection 6-10. In order to minimise the depth of drilling, while ensuring a substantial gap in the conductive path, the hole 3 is chamfered to give a conical insulating surface 12 between the lining 5 and the pad 9. A chamfer is particularly suitable when a current path is to be broken during development or on installation, since it is easily produced using a drill hand-held in a pin vice for example. The interconnection 8-10 may of course be broken by drilling the hole 3 oversize from the end opposite to that for which the chamfer 12 is shown. It will be noted particularly that the greatest diameter of the chamfered surface 12 lies within the width of the pad 9 so that the conductor 8 remains continuous from one end of the pad 9 to the other. The width of the pads 7, 9 and 11 is also sufficient to enable the plating of a hole drilled by mistake to be reconnected by means of a conductive eyelet or clip which can be pressed into the hole to make contact with the pad on each side of the board or with one pad and a remaining portion of wall plating.

Figure 1C:
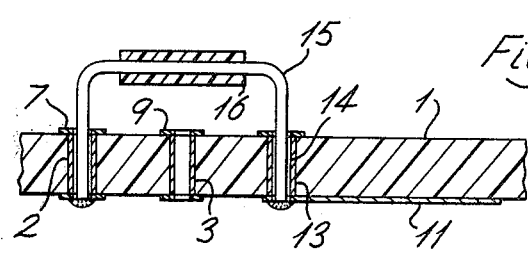
FIG. 1c represents diagrammatically a printed circuit board using a conventional wire bridge.

The simplicity of the operation illustrated in FIG. 1b may be compared with the use of a wire bridge shown in section at FIG. 1c to accomplish the same result in the conventional manner. The board 1 again carries the conductors 6 and 8 (not shown) which make contact at pads 7 and 9 with plated holes 2 and 3 respectively. The conductor 10 must initially be isolated from holes 2 and 3 and requires as a connecting point at pad 11 an additional hole 13 with a conductive lining 14. To make the interconnection 6-10 a wire bridge 15 is soldered into the holes 2 and 13 and similarly would be soldered between the holes 3 and 13 for an interconnection 8-10. Usually the bridge 15 is fitted with an insulating sleeve 16 to prevent accidental contact with the printed circuit. Since the number of points in the circuit at which selection is required may be quite large the provision of an additional hole at each point and the labour of soldering bridge connections may represent significant extra cost.

Figure 2:
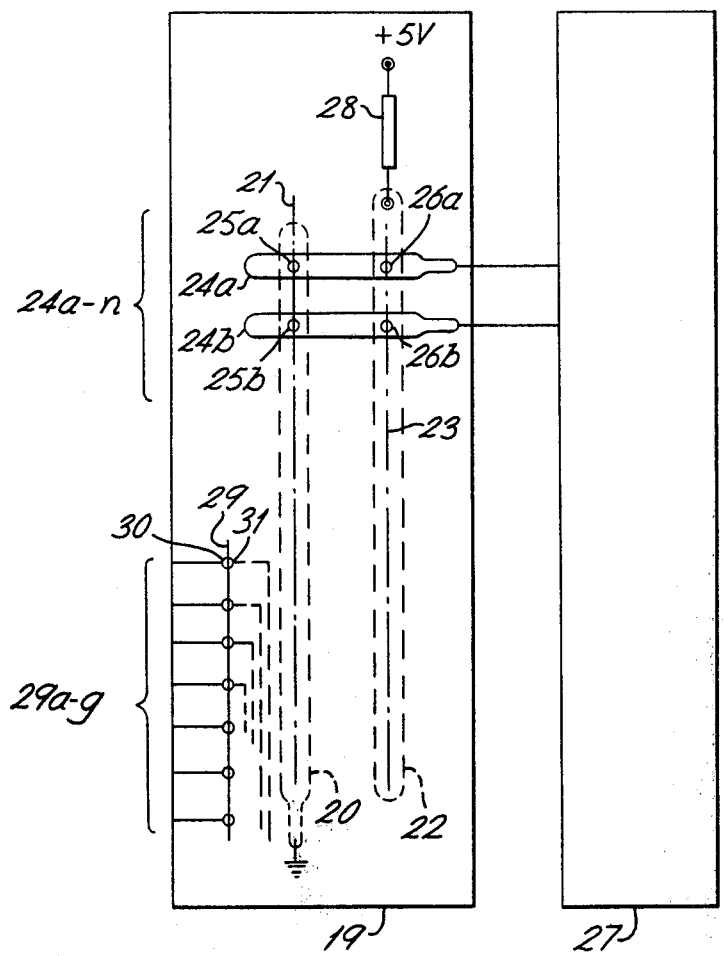
FIG. 2 illustrates the use of a printed circuit board in accordance with the invention in the control of input-output connections to a computer.

Referring to FIG. 2 a printed circuit board in accordance with the invention is shown as applied to the control of the input-output connections for a computer. The underside of a board 19 carries a printed conductor 20 which makes contact with each hole of a column 21 of plated-through holes and a conductor 22 which makes contact with each hole of a similar column 23. A printed conductor 24a lies on the upper surface of the board 19 transversely to the conductors 20, 22 and makes contact with a hole 25a of the column 21 and a hole 26a of the column 23 and similarly further transverse conductors 24 such as the conductor 24b make contact with further similar holes such as the holes 25b and 26b. Each of the conductors 24 is connected into an input-output interface logic unit 27, the conductor 20 is held at earth potential and the conductor 22 at a TTL bias potential of +5V connected via a resistor 28. Input-output controller address selection requires each address gate within the unit 27 to be referred to the potential of either the conductor 20 or the conductor 22 and this is done for each gate via one of the conductors 24 (say 24a to k) the appropriate one of the corresponding holes 25, 26 being drilled out. Similarly the correct phase for input data from peripheral devices is selected by connecting the common reference input of all input gates to one of the conductors 24 (say 24m) and again drilling out the appropriate one of holes 25m, 26m. The use of links to perform the address function is much less economical and convenient since an individual resistor, with two plated-through holes to accommodate it, must then be provided for each address bit. When using links for phase selection an inverter is necessary for each bit which differs in phase from the majority of bits. Two two-way selection functions have been described above as examples of the use of the invention arising in a particular application. In the same application a one-way selection also arises in determining the vector-address in the associated computer to be used by the input-output controller. This merely requires one connection for each digit from the unit 27 to a further series of plated holes 29 (say 29a to g) on the board 19. If these connections such as the connection 30 at the hole 29a are made on the upper surface of the board 19, connections such as the connection 31 at the same hole are made to the computer from the underside of the board 19. Each vector bit becomes a '1' if the hole is left intact or a '0' if the hole is drilled out.

The circuit board of the invention is particularly advantageous in its application to experimental systems but may also be used where a number of different variations on a common pattern is to be produced in quantity. This may be done for example by tape controlled drilling of a board of a standard design according to an appropriate program.

I claim:

1. A method for producing a printed circuit on a board of insulating material to provide selective connection between conductive areas on one face of the board and conductive areas on the other face of the board, the board being pierced by a plurality of holes, each hole extending from a conductive area on said one face to a conductive area on the other face and each of the holes having initially a wall lining of conductive material effective to provide electrical connection between the respective conductive area on one face of the board and conductive area on the other face, the method comprising the step of removing the conductive lining material from individual holes to an extent effective to break the electrical connection provided by such lining between the associated conductive areas.

2. A method for producing a printed circuit on a board of insulating material to provide selective connection between conductive areas on one face of the board and conductive areas on the other face of the board, the board being pierced by a plurality of holes, each hole extending from a conductive area on said one face to a conductive area on the other face, the method comprising the steps of providing for each of the holes a wall lining of conductive material effective to provide electrical connection between the respective conductive area on one face of the board and conductive area on the other face and removing the conductive lining from individual holes to an extent effective to break the electrical connection provided by such lining between the associated conductive areas.

3. A method according to claim 1 in which the step of removing the conductive lining material comprises the operation of at least partially enlarging said individual holes.

4. A method according to claim 3 in which said operation comprises chamfering one end of the individual hole to expose the insulating material of the board.

5. A method according to claim 3 in which said operation comprises boring the individual hole to an increased diameter over at least part of its length.

* * * * *